US008269344B2

(12) United States Patent
Rofougaran

(10) Patent No.: US 8,269,344 B2
(45) Date of Patent: *Sep. 18, 2012

(54) METHOD AND SYSTEM FOR INTER-CHIP COMMUNICATION VIA INTEGRATED CIRCUIT PACKAGE WAVEGUIDES

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 507 days.

This patent is subject to a terminal disclaimer.

(21) Appl. No.: 12/058,423

(22) Filed: Mar. 28, 2008

(65) Prior Publication Data

US 2009/0245808 A1  Oct. 1, 2009

(51) Int. Cl.
*H01L 23/58* (2006.01)
(52) U.S. Cl. ............... 257/728; 257/E23.002; 333/108
(58) Field of Classification Search .............. 257/431, 257/461, 728, E23.002; 333/105, 108
See application file for complete search history.

(56) References Cited

U.S. PATENT DOCUMENTS

| | | | |
|---|---|---|---|
| 4,904,036 A * | 2/1990 | Blonder .................... | 385/14 |
| 5,914,873 A | 6/1999 | Blish, II | |
| 5,990,757 A * | 11/1999 | Tonomura et al. ........... | 333/17.2 |
| 6,570,442 B2 | 5/2003 | Nakai et al. | |
| 6,590,468 B2 | 7/2003 | du Toit et al. | |
| 6,848,178 B2 | 2/2005 | Kondo et al. | |
| 7,002,439 B2 * | 2/2006 | Rottenberg et al. ........... | 333/262 |
| 7,045,440 B2 | 5/2006 | Huff et al. | |
| 7,084,715 B2 | 8/2006 | Al-Taei et al. | |
| 7,138,884 B2 | 11/2006 | Cheung et al. | |
| 7,149,496 B2 | 12/2006 | Horiuchi et al. | |
| 7,183,633 B2 | 2/2007 | Daneman et al. | |
| 7,289,008 B2 | 10/2007 | Kuroki et al. | |
| 7,336,232 B1 | 2/2008 | Lee et al. | |
| 7,348,842 B2 | 3/2008 | Ichitsubo et al. | |
| 7,385,286 B2 | 6/2008 | Iwaki et al. | |
| 7,402,897 B2 * | 7/2008 | Leedy ........................... | 257/678 |
| 7,405,477 B1 * | 7/2008 | Tao et al. ...................... | 257/728 |
| 7,515,879 B2 | 4/2009 | Okabe et al. | |
| 7,518,248 B2 | 4/2009 | Li et al. | |
| 7,718,461 B2 * | 5/2010 | Weller et al. .................. | 438/59 |
| 2004/0080917 A1 * | 4/2004 | Steddom et al. ............. | 361/748 |
| 2004/0222506 A1 | 11/2004 | Wei et al. | |
| 2005/0023656 A1 * | 2/2005 | Leedy .......................... | 257/678 |
| 2005/0161753 A1 | 7/2005 | Huff et al. | |
| 2005/0212642 A1 | 9/2005 | Pleskach et al. | |
| 2006/0152911 A1 | 7/2006 | Humbert et al. | |
| 2007/0062027 A1 | 3/2007 | Ripamonti et al. | |
| 2008/0075405 A1 * | 3/2008 | Wang et al. ................. | 385/14 |
| 2008/0083938 A1 * | 4/2008 | Liang et al. .................. | 257/292 |
| 2008/0237591 A1 * | 10/2008 | Leedy ............................ | 257/48 |
| 2009/0110014 A1 * | 4/2009 | Miller et al. .................. | 372/34 |
| 2009/0127674 A1 * | 5/2009 | Suzuki ......................... | 257/659 |
| 2009/0245808 A1 * | 10/2009 | Rofougaran .................. | 398/141 |
| 2009/0315637 A1 * | 12/2009 | Rofougaran .................. | 333/105 |
| 2009/0318105 A1 * | 12/2009 | Rofougaran et al. ......... | 455/323 |

* cited by examiner

*Primary Examiner* — Allan R Wilson
(74) *Attorney, Agent, or Firm* — Farjami & Farjami LLP

(57) ABSTRACT

Methods and systems for inter-chip communication via integrated circuit package waveguides are disclosed and may include communicating one or more signals between or among a plurality of integrated circuits via one or more waveguides integrated in a multi-layer package. The integrated circuits may be bonded to the multi-layer package. The waveguides may be configured via switches in the integrated circuits or by MEMS switches integrated in the multi-layer package. The signals may include a microwave signal and a low frequency control signal that may configure the microwave signal. The low frequency control signal may include a digital signal. The waveguides may comprise metal and/or semiconductor layers deposited on and/or embedded within the multi-layer package.

19 Claims, 5 Drawing Sheets

METHOD AND SYSTEM FOR INTER-CHIP COMMUNICATION VIA INTEGRATED CIRCUIT PACKAGE WAVEGUIDES

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for inter-chip communication via integrated circuit package waveguides.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for inter-chip communication via integrated circuit package waveguides, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for inter-chip communication via integrated circuit package waveguides. Exemplary aspects of the invention may comprise communicating one or more signals between or among a plurality of integrated circuits via one or more waveguides integrated in a multi-layer package. The integrated circuits may be bonded to the multi-layer package. The waveguides may be configured via switches in the integrated circuits or by MEMS switches integrated in the multi-layer package. The signals may comprise a microwave signal and a low frequency control signal that may configure the microwave signal. The low frequency control signal may comprise a digital signal. The waveguides may comprise metal and/or semiconductor layers deposited on and/or embedded within the multi-layer package.

Figure 1:
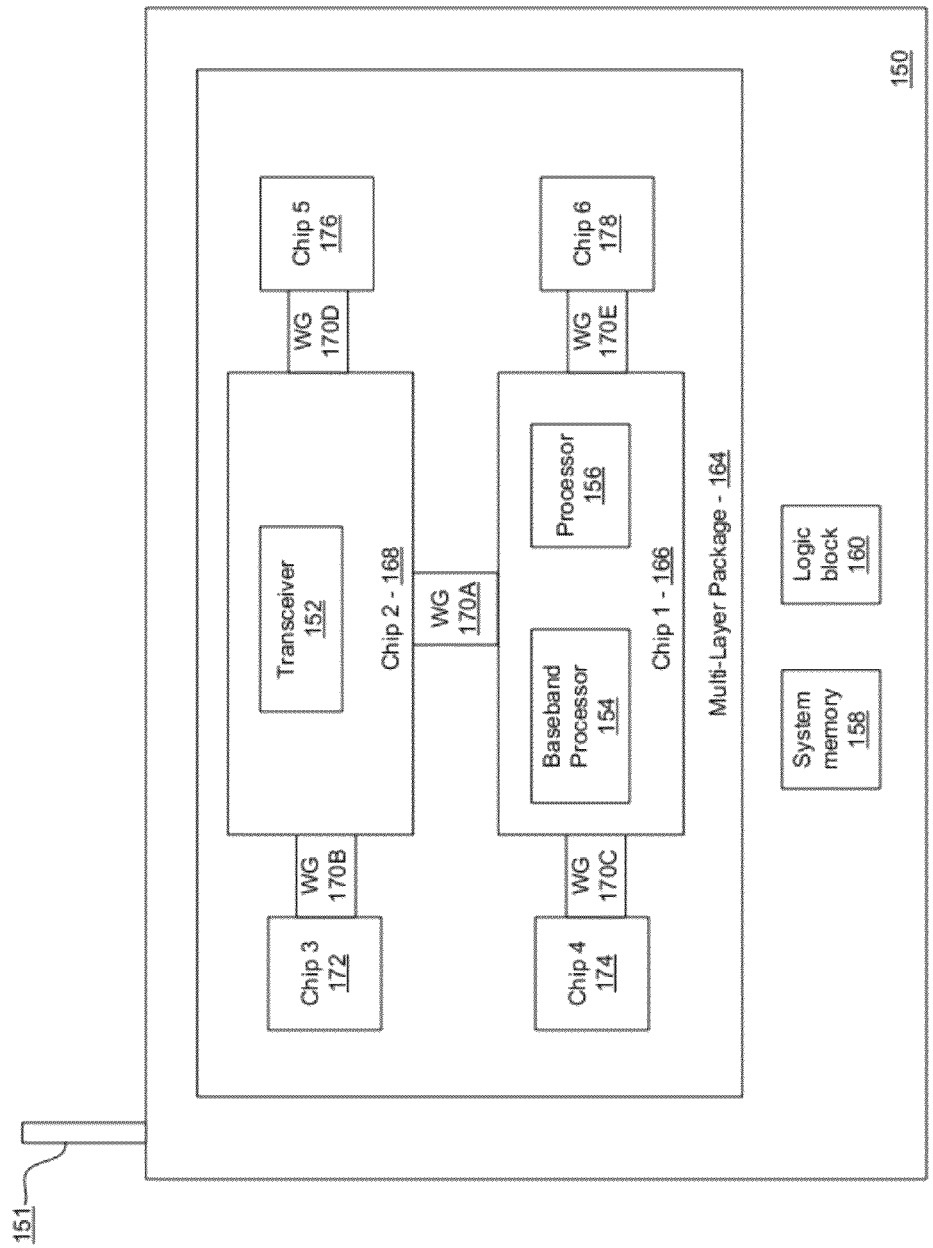
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a system memory 158, a logic block 160, and a multi-layer package 164. The multi-layer package 164 may comprise a chip 1 166, a chip 2 168, waveguides 170A, 170B, 170C, 170D, and 170E, a chip 3 172, a chip 4 174, a chip 5 176, and a chip 6 178. In an exemplary embodiment of the invention, the chip 1 166 may comprise a baseband processor 154 and a processor 156, and the chip 2 168 may comprise a transceiver 152. The chip 3 172, chip 4 174, chip 5 176, and chip 6 178 may comprise circuitry for any functions of the wireless system 150. However, the invention may not be limited to the number of chips and waveguides shown in FIG. 1. Any number of components and/or arrangements of circuitry may be integrated on any particular chip bonded to the multi-layer package 164, and any number of waveguides may be integrated within the multi-layer package 164 to enable communication between chips as defined by space on the multi-layer package 164 and the functional requirements of the wireless system 150. The antenna 151 may be used for reception and/or transmission of RF signals.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering, coupling, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality transceivers, transmitters and/or receivers. In this regard, the plurality of transceivers, transmitters and/or receivers may enable the wireless system 150 to handle a plurality of wireless protocols and/or standards including cellular, WLAN and PAN.

The multi-layer package 164 may comprise multiple layers of insulator and conductive material for integrating multiple devices within the package. The multi-layer package 164 may enable the coupling of multiple devices to one or more integrated circuits, or chips. In an embodiment of the invention, integrated circuits may be flip-chip bonded to the multi-layer package 164. In this manner, devices integrated into the multi-layer package 164 may be coupled to devices within an integrated circuit with low parasitic impedances. One or more waveguides, such as the waveguides 170A-170E may enable communication between the chips.

The waveguides 170A-170E may comprise suitable circuitry, logic and/or code that may enable the communication of electromagnetic signals between devices on and/or integrated within the multi-layer package 164. The waveguides 170A-170E may be configured to communicate at a specific frequency, 60 GHz or greater, for example, while still allowing low frequency control signals to propagate between devices. The control signals may allow setup, configuration and management of the microwave signal communication in the wireless system 150, for example.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

In operation, control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. In an embodiment of the invention, the processor 156 may configure the waveguides 170A-170E to communicate signals of a desired frequency, 60 GHz or higher, for example, between the chips.

Additionally, low frequency, or out-of-band control signals, such as a system management bus (SMBus) signal, for example, may also be communicated via the waveguide 170. In some instances, the low-frequency wire interfaces may be used to improve Bluetooth-WLAN coexistence and/or antenna sharing in some instances. The 3-wire interface, for example, may be used for Bluetooth-WLAN coexistence, in accordance with the IEEE 802.15.2 Recommended Practice. The 2-wire and 3-wire interface techniques may not permit the transmission of sophisticated data management data to a centralized management device and may be limited to blocking the resource access of one device while a transmission, for example, may be taking place on the other device.

Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

Figure 2A:
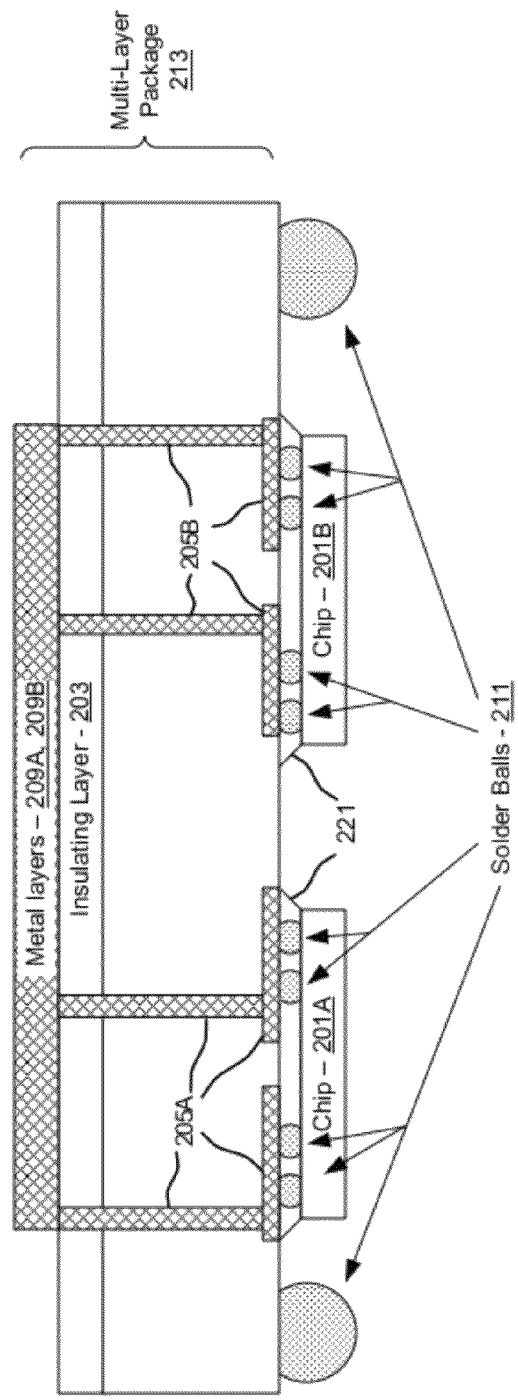
FIG. 2A is a block diagram illustrating a cross-sectional view of a multi-layer package with waveguides, in accordance with an embodiment of the invention.

FIG. 2A is a block diagram illustrating a cross-sectional view of a multi-layer package with waveguides, in accordance with an embodiment of the invention. Referring to FIG. 2A, there is shown chips 201A and 201B, an insulating layer 203, metal layers 205A, 205B, 209A, and 209B, solder balls 211, a multi-layer package 213, and thermal epoxy 221.

The chips 201A and 201B, or integrated circuits, may comprise one or more components and/or systems within the wireless system 150. The chips 201A and 201B may be bump-bonded or flip-chip bonded to the multi-layer package 213 utilizing the solder balls 211. In this manner, wire bonds connecting the chips 201A and 201B to the multi-layer package 213 may be eliminated, thereby reducing and/or eliminating uncontrollable stray inductances due to wire bonds, for example. In addition, the thermal conductance out of the chips 201A and 201B may be greatly improved utilizing the solder balls 211 and the thermal epoxy 221. The thermal epoxy 221 may be electrically insulating but thermally conductive to allow for thermal energy to be conducted out of the chips 201A and 201B to the much larger thermal mass of the multilayer package 213.

The metal layers 205A, 205B, 209A, and 209B may comprise deposited metal layers utilized to delineate waveguides and other devices. The metal layers 209A, and 209B may be patterned such that they may comprise waveguides that may be utilized to communicate signal between chips coupled to the multi-layer package 213, such as the chips 201A and 201B. The metal layers 209A and 209B may comprise a coplanar waveguide structure. The insulating layer 203 may comprise a layer of resistive material that may provide electrical isolation between the metal layers 209A and 209B and other layers and/or devices in the multi-layer package 213.

In another embodiment of the invention, one or more of the metal layers may comprise ferromagnetic and/or ferrimagnetic layers utilized to define devices such as transformers, inductors, baluns, isolators, circulators, and gyrators.

The metal layers 205A and 205B, and 205C may provide electrical contact from the waveguide comprising the metal layers 209A and 209B and the chips 201A and 201B via the solder balls 211. The number of metal layers may not be limited to the number of metal layers 205A, 205B, 209A, and 209B shown in FIG. 2A. Accordingly, there may be any number of layers embedded within and/or on the multi-layer package 213, depending on the number of contacts on the chips 201A and 201B coupled to the solder balls 211, and the number of waveguides and other devices fabricated within and/or on the multi-layer package 213.

The solder balls 211 may comprise spherical balls of metal to provide electrical, thermal and physical contact between the chips 201A and 201B and the multi-layer package 213. In making the contact with the solder balls 211, the chips may be pressed with enough force to squash the metal spheres somewhat, and may be performed at an elevated temperature to provide suitable electrical resistance and physical bond strength. The thermal epoxy 221 may fill the volume between the solder balls 211 and may provide a high thermal conductance path for heat transfer out of the chips 201A and 201B. The solder balls 211 may also be utilized to provide electrical, thermal and physical contact between the multi-layer package 213 and a printed circuit board comprising other parts of the wireless system 150, described with respect to FIG. 1.

In operation, the chips 201A and 201B may comprise an RF front end, such as the RF transceiver 152, described with respect to FIG. 1, and may be utilized to transmit and receive RF signals. The chips 201A and 201B may be electrically coupled to the multi-layer package 213 and may communicate via waveguides integrated on the multi-layer package 213. Heat from the chips 201A and 201B may be conducted to the multi-layer package 213 via the thermal epoxy 221 and the solder balls 211. In an embodiment of the invention, a processor, such as the processer 156 described with respect to FIG. 1, may configure the waveguide comprising the metal layers 209A and 209B such that the chips 201A and 201B may communicate via the waveguide, providing a high frequency signal path, 60 GHz or higher, for example, as well as providing a path for low frequency control signals for the chips 201A and 201B. The low frequency control signals may comprise 3-wire signals comprising clock and data streams, for example.

The waveguides comprising the metal layers 209A and 209B may be configured by adjusting the length of the structures, and may be configurable via switches in the chips 201A and/or 201B and/or MEMS switches integrated in the multi-layer package 213. In this manner, the communication parameters of waveguides integrated into the multi-layer package may be configured for a plurality of applications.

By integrating waveguides in the multi-layer package 213, stray impedances may be greatly reduced compared to wire-bonded connections to devices on printed circuit boards as in conventional systems. In this manner, volume requirements may be reduced and performance may be improved due to lower losses and accurate control of impedances via switches in the chips 201A and 201B or on the multi-layer package 213, for example. In another embodiment of the invention, the metal layers 209A and 209B may be deposited on the same side of the multi-layer package 213, such that the metal layers 205A and 205B may not be needed to couple the waveguide to the chips 201A and 201B.

Figure 2B:
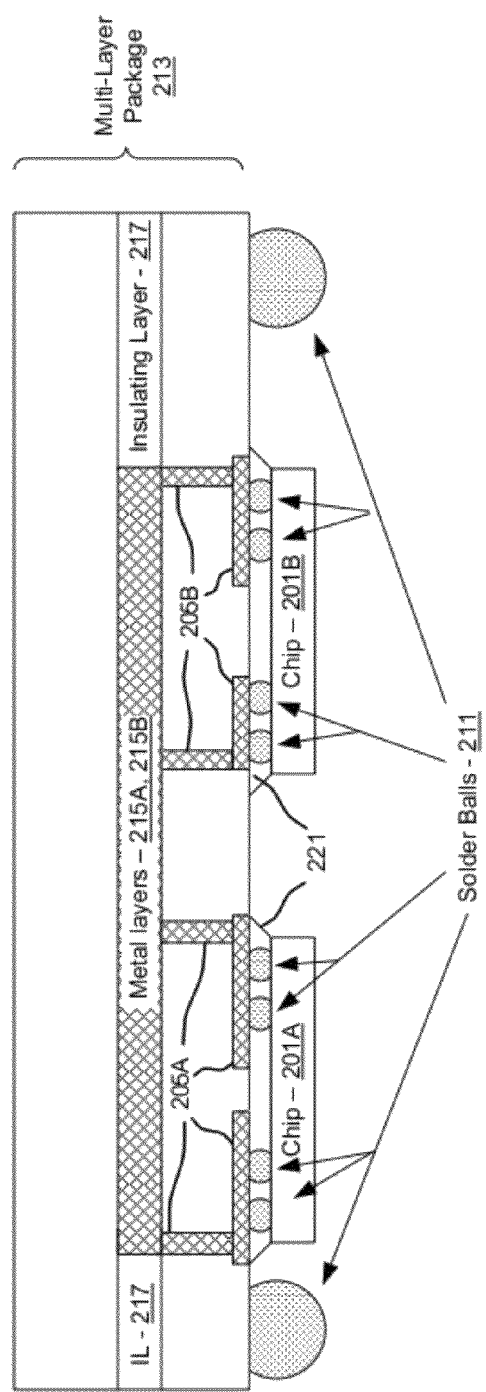
FIG. 2B is a block diagram illustrating a cross-sectional view of a multi-layer package with embedded waveguides, in accordance with an embodiment of the invention.

FIG. 2B is a block diagram illustrating a cross-sectional view of a multi-layer package with embedded waveguides, in accordance with an embodiment of the invention. Referring to FIG. 2A, there is shown the chips 201A and 201B, metal layers 205A, 205B, 215A, and 215B, the solder balls 211, the multi-layer package 213, the insulating layer 217, and thermal epoxy 221. The structure shown in FIG. 2B is substantially similar to that in FIG. 2A, except that the waveguide comprising the metal layers 215A and 215B may be embedded within the multi-layer package 213. In this manner, a length of the metal layers 205A and 205B may be reduced, thereby reducing stray impedances, for example. In addition, integrating the metal layers 215A and 215B may allow more space for other components on the surface of the multi-layer package 213.

The insulating layer 217 may comprise a layer of resistive material that may provide electrical isolation between the metal layers 215A and 215B and other layers and/or devices in the multi-layer package 213.

In operation, the chips 201A and 201B may comprise an RF front end, such as the RF transceiver 152, described with respect to FIG. 1, and may be utilized to transmit and receive RF signals. The chips 201A and 201B may be electrically coupled to the multi-layer package 213 and may communicate via one or more waveguides integrated within the multi-layer package 213. Heat from the chips 201A and 201B may be conducted to the multi-layer package 213 via the thermal epoxy 221 and the solder balls 211. In an embodiment of the invention, a processor, such as the processer 156 described with respect to FIG. 1, may configure the waveguide comprising the metal layers 215A and 215B such that the chips 201A and 201B may communicate via the waveguide, providing a high frequency signal path, 60 GHz or higher, for example, as well as providing a path for low frequency control signals for the chips 201A and 201B. The low frequency control signals may comprise 3-wire signals comprising clock and data streams, for example.

The waveguides within the metal layers 215A and 215B may be configured by adjusting the length of the structures, and may be configurable via switches in the chips 201A and/or 201B and/or MEMS switches integrated in the multi-layer package 213. In this manner, the communication parameters of waveguides integrated into the multi-layer package may be configured for a plurality of applications.

Figure 3:
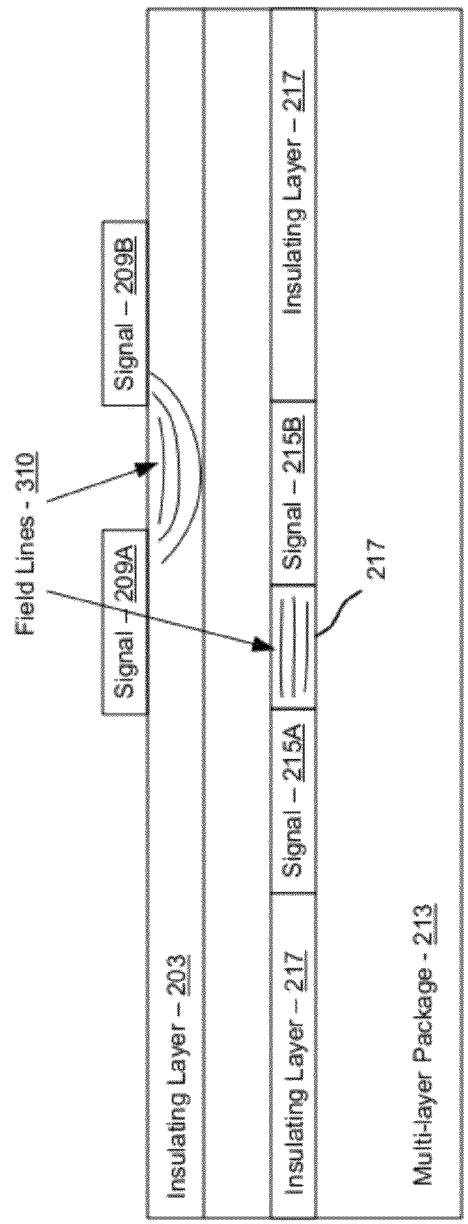
FIG. 3 is a block diagram illustrating a cross-sectional view of coplanar waveguides, in accordance with an embodiment of the invention.

FIG. 3 is a block diagram illustrating a cross-sectional view of coplanar waveguides, in accordance with an embodiment of the invention. Referring to FIG. 3, there is shown coplanar waveguides comprising the metal layers 209A, 209B and the insulating layer 203 and also the metal layers 215A and 215B and the insulating layer 217, described with respect to FIGS. 2A and 2B, and the field lines 310. The metal layers 209A/209B and 215A/215B may comprise signals lines for the waveguides, and the electric fields between the metal lines, as indicated by the field lines 310, may be configured by the dielectric constant of the material, or air, between the layers as well as the spacing between them. In the case of the metal layers 215A and 215B, the dielectric constant of the insulating layer 217 may configure the electric field. In another embodiment of the invention, the metal layers 209A/209B and 215A/215B may comprise poly-silicon or other conductive material. The insulating layers 203 and 217 may be as described with respect to FIGS. 2A and 2B.

In operation, one or more signals may be applied across the metal layers 209A and 209B, and/or the metal layers 215A and 215B. The waveguides defined by the metal layers 209A/209B and 215A/215B may enable communication between integrated circuits, such as the chips 201A and 210B coupled to the multi-layer package 213. In this manner, a high frequency signal path may be utilized while reducing system cost and size by integrating configurable devices in an integrated circuit package, such as the multi-layer package 213.

Figure 4:
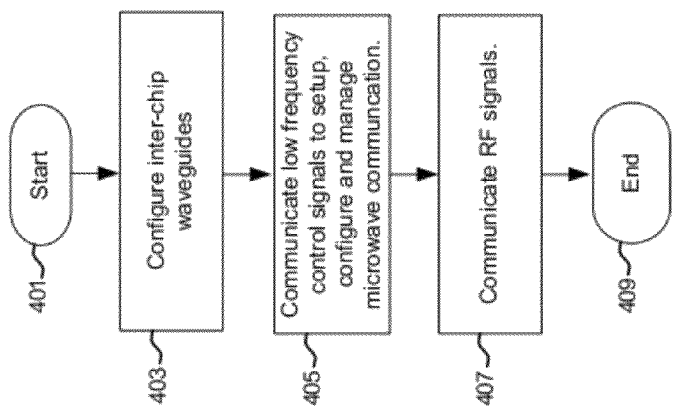
FIG. 4 is a block diagram illustrating exemplary inter-chip communication via waveguides integrated in a multi-layer package, in accordance with an embodiment of the invention.

FIG. 4 is a block diagram illustrating exemplary inter-chip communication via waveguides integrated in a multi-layer package, in accordance with an embodiment of the invention. In step 403, after start step 401, one or more waveguides may be configured for desired signal transmission frequencies. In step 405, low frequency control signals may be communicated to setup, configure and/or manage microwave communication, followed by step 407, where a microwave signal may be communicated via the waveguide comprising the metal layers 209A/209B and/or 215A/215B, followed by end step 409.

In an embodiment of the invention, a method and system are disclosed for inter-chip communication via integrated circuit package waveguides. Exemplary aspects of the invention may comprise communicating one or more signals between or among a plurality of integrated circuits 201A and 201B via one or more waveguides 170A-170E integrated in a multi-layer package 164/213. The integrated circuits 201A and 201B may be bonded to the multi-layer package 213. The waveguides 170A-170E may be configured via switches in the integrated circuits 201A and 201B or by MEMS switches integrated in the multi-layer package 213. The signals may comprise a microwave signal and a low frequency control signal that may configure the microwave signal. The low frequency control signal may comprise a digital signal. The waveguides 170A-170E may comprise metal and/or semiconductor layers 209A, 209B, 215A, and 215B deposited on and/or embedded within the multi-layer package 213.

Certain embodiments of the invention may comprise a machine-readable storage having stored thereon, a computer program having at least one code section for inter-chip communication via integrated circuit package waveguides, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
in a multi-layer package with one or more electrical waveguides integrated therein, and a plurality of chips bonded to said multi-layer package, wherein said one or more electrical waveguides are outside of said plurality of chips, and when said plurality of chips are bonded to said multi-layer package, said one or more electrical waveguides integrated in said multi-layer package provide interconnections between said plurality of chips:
communicating one or more electrical signals between or among said plurality of chips via said one or more electrical waveguides integrated in said multi-layer package.

2. The method according to claim 1, comprising configuring said one or more electrical waveguides via switches integrated within each of said plurality of chips.

3. The method according to claim 1, comprising configuring said one or more electrical waveguides via MEMS switches integrated in said multi-layer package.

4. The method according to claim 1, wherein said one or more electrical signals comprises a microwave signal.

5. The method according to claim 1, comprising configuring said communication of said one or more electrical signals via a low frequency control signal.

6. The method according to claim 5, wherein said low frequency control signal comprises a digital signal.

7. The method according to claim 1, wherein said one or more electrical waveguides comprise metal layers embedded within said multi-layer package.

8. The method according to claim 1, wherein said one or more electrical waveguides comprise semiconductor layers embedded within said multi-layer package.

9. A system for wireless communication, the system comprising:
    one or more circuits enabling communication of one or more electrical signals between or among each of a plurality of chips via one or more electrical waveguides integrated in said multi-layer package, wherein said one or more electrical waveguides are outside of said plurality of chips, and when said plurality of chips are bonded to said multi-layer package, said one or more electrical waveguides integrated in said multi-layer package provide interconnections between said plurality of chips.

10. The system according to claim 9, wherein said one or more circuits enables configuration of said one or more electrical waveguides via switches integrated within each of said plurality of chips.

11. The system according to claim 9, wherein said one or more circuits enables configuration of said one or more electrical waveguides via MEMS switches integrated in said multi-layer package.

12. The system according to claim 9, wherein said one or more electrical signals comprises a microwave signal.

13. The system according to claim 9, wherein said one or more circuits enables configuration of said communication of said one or more electrical signals via a low frequency control signal.

14. The system according to claim 13, wherein said low frequency control signal comprises a digital signal.

15. The system according to claim 9, wherein said one or more electrical waveguides comprise metal layers deposited on said multi-layer package.

16. The system according to claim 9, wherein said one or more electrical waveguides comprise semiconductor layers deposited on said multi-layer package.

17. A method comprising:
    providing a multi-layer package with one or more electrical waveguides integrated therein;
    bonding a plurality of chips to said multi-layer package;
    wherein said one or more electrical waveguides are outside of said plurality of chips, and when said plurality of chips are bonded to said multi-layer package, said one or more electrical waveguides integrated in said multi-layer package provide interconnections between said plurality of chips.

18. The method according to claim 17 further comprising:
    depositing metal layers in said multi-layer package to form said one or more electrical waveguides.

19. The method according to claim 17 further comprising:
    depositing semiconductor layers in said multi-layer package to form said one or more electrical waveguides.

* * * * *